United States Patent
Andrieu et al.

(10) Patent No.: US 9,558,957 B2
(45) Date of Patent: Jan. 31, 2017

(54) METHOD FOR MANUFACTURING A SUBSTRATE PROVIDED WITH DIFFERENT ACTIVE AREAS AND WITH PLANAR AND THREE-DIMENSIONAL TRANSISTORS

(71) Applicant: COMMISSARIAT A L'ENERGIE ATOMIQUE ET AUX ENERGIES ALTERNATIVES, Paris (FR)

(72) Inventors: Francois Andrieu, Grenoble (FR); Sebastien Barnola, Villard-Bonnot (FR); Jerome Belledent, Meylan (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 13/894,890

(22) Filed: May 15, 2013

(65) Prior Publication Data

US 2013/0309854 A1 Nov. 21, 2013

(30) Foreign Application Priority Data

May 16, 2012 (FR) ...................................... 12 01412

(51) Int. Cl.
*H01L 21/308* (2006.01)
*H01L 21/3213* (2006.01)
(Continued)

(52) U.S. Cl.
CPC ....... *H01L 21/3088* (2013.01); *H01L 21/0337* (2013.01); *H01L 21/3086* (2013.01); *H01L 21/32139* (2013.01); *H01L 21/823431* (2013.01)

(58) Field of Classification Search
CPC ............. H01L 21/0337; H01L 21/0338; H01L 21/31138; H01L 21/31144; H01L 21/32139; H01L 21/3086; H01L 21/3088; H01L 21/823431; H01L 27/11534
See application file for complete search history.

(56) References Cited

U.S. PATENT DOCUMENTS 5,328,810 A * 7/1994 Lowrey et al. ................ 430/313
6,723,607 B2 * 4/2004 Nam et al. ..................... 438/275
(Continued)

FOREIGN PATENT DOCUMENTS

FR 2 963 477 A1 2/2012

OTHER PUBLICATIONS

Aug. 16, 2013 Expanded European Search Report issued in European Application No. 13354016.1 (with translation).

*Primary Examiner* — Brett Feeney
*Assistant Examiner* — Sophia Nguyen
(74) *Attorney, Agent, or Firm* — Oliff PLC

(57) ABSTRACT

A substrate is successively provided with a support (7), an electrically insulating layer (8), and a semi-conductor material layer (2). A first protective mask (1) completely covers a second area (B) of the semi-conductor material layer and leaves a first area (A) of the semi-conductor material layer uncovered. A second etching mask (3) partially covers the first area (A) and at least partially covers the second area (B), so as to define and separate a first area and a second area. Lateral spacers are formed on the lateral surfaces of the second etching mask (3) so as to form a third etching mask. The semi-conductor material layer (2) is etched by means of the third etching mask so as to form a pattern made from semi-conductor material in the first area (A), the first etching mask (3) protecting the second area (B).

13 Claims, 9 Drawing Sheets

(51) Int. Cl.
*H01L 21/033* (2006.01)
*H01L 21/8234* (2006.01)

(56) References Cited

U.S. PATENT DOCUMENTS

| | | | | |
|---|---|---|---|---|
| 6,955,961 | B1 * | 10/2005 | Chung | 438/241 |
| 7,071,047 | B1 * | 7/2006 | Furukawa et al. | 438/197 |
| 7,807,575 | B2 * | 10/2010 | Zhou | 438/696 |
| 7,972,967 | B1 * | 7/2011 | Hyun | H01L 21/0337 438/703 |
| 8,106,519 | B2 * | 1/2012 | Hong | 257/775 |
| 8,123,968 | B2 * | 2/2012 | Bai et al. | 216/47 |
| 8,563,229 | B2 * | 10/2013 | Tran | 430/323 |
| 8,951,918 | B2 * | 2/2015 | Li et al. | 438/702 |
| 2003/0230234 | A1 | 12/2003 | Nam et al. | |
| 2005/0272259 | A1 * | 12/2005 | Hong | 438/669 |
| 2006/0081895 | A1 | 4/2006 | Lee et al. | |
| 2009/0035584 | A1 * | 2/2009 | Tran et al. | 428/446 |
| 2009/0221132 | A1 * | 9/2009 | Oba | 438/478 |
| 2010/0093173 | A1 * | 4/2010 | Park et al. | 438/689 |
| 2010/0096719 | A1 * | 4/2010 | Lee | H01L 21/0332 257/506 |
| 2010/0136790 | A1 * | 6/2010 | Chang et al. | 438/694 |
| 2010/0240221 | A1 * | 9/2010 | Kim | H01L 21/0337 438/725 |
| 2010/0291771 | A1 | 11/2010 | Zhou et al. | |
| 2011/0147881 | A1 * | 6/2011 | Fenouillet-Beranger et al. | 257/506 |
| 2012/0108070 | A1 * | 5/2012 | Kim | 438/703 |
| 2012/0132616 | A1 * | 5/2012 | Barnola et al. | 216/41 |
| 2012/0322224 | A1 * | 12/2012 | Jeong et al. | 438/382 |

\* cited by examiner

METHOD FOR MANUFACTURING A SUBSTRATE PROVIDED WITH DIFFERENT ACTIVE AREAS AND WITH PLANAR AND THREE-DIMENSIONAL TRANSISTORS

BACKGROUND OF THE INVENTION

The invention relates to a method for manufacturing a substrate of semi-conductor on insulator type.

STATE OF THE ART

The continuous increase of the performances of integrated circuits, for example, in terms of consumption and/or operating frequency, is ineluctably resulting in a constant reduction of the size of its components and in an increase of their density. In order to produce devices with ever-improved performances, new techniques have been accomplished for defining patterns of small sizes.

New architectures of active devices, such as transistors, have been achieved. These new architectures no longer present a planar structure as was able to be the case in conventional technologies, but they have an integration called three-dimensional. In order to manufacture these new types of transistors simply, for example FinFET transistors, it is necessary to etch a semi-conductor layer of the substrate to define the whole volume of semi-conductor material used by the device. The reduction of the size of the transistor results in difficulties in definition, in large density, of patterns of small dimensions.

However, in an integrated circuit, it is also necessary to have different types of transistors, i.e. transistors with different dimensions in order to be able to perform very specific functions by means of the transistor best suited to the identified requirements. This then results in large difficulties in manufacturing substrates simultaneously comprising semi-conductor areas formed by one or more pads of small dimensions and semi-conductor areas formed by much larger active areas.

The document US2006/0081895 describes manufacturing of a semi-conductor device comprising FinFET transistors and transistors called planar transistors.

As illustrated in FIGS. 1 and 2, a substrate made from semi-conductor material is partially covered by a first mask 1. First mask 1 is deposited on the substrate so as to define two complementary surfaces. One of the two surfaces is etched so as to form a thinned area, and the other surface is not etched so as to form a thick area in semi-conductor material 2.

As illustrated in FIG. 3, a second etching mask 3 is formed so as to define the different active areas of the substrate. These active areas are defined in the thin areas and in the thick areas of semi-conductor film 2.

As illustrated in FIG. 4, semi-conductor film 2 is etched so as to define active areas in the thin area and in the thick area. The thin area is etched to form active areas of large sizes for integration of planar transistors. The thick area is etched to form patterns of small size for integration of future FinFET transistors.

As illustrated in FIG. 5, a dielectric material is deposited and planarized to form an insulation pattern 4 which electrically insulates the different active areas from one another and which covers the different active areas of the thin area. A second photolithography step is performed on the thick areas to form a third etching mask 5 which protects the thick areas, and the dielectric material is etched to access second etching mask 3 and release semi-conductor material 2 located underneath.

A second dielectric material and a buffer layer 6 are deposited. As illustrated in FIG. 6, buffer layer 6 is planarized so as to release second etching mask 3 in the thick area and to protect semi-conductor film 2 in the thin area.

As illustrated in FIG. 7, insulation pattern 4 is partially eliminated and buffer layer 6 is completely eliminated to access the side walls of the active areas of the thick area and the active areas of the thin layer.

It can be observed that this manufacturing method is particularly difficult to implement and requires numerous photolithography steps which limits the possibilities of simultaneously forming areas of small size with a high density and areas of larger size.

This implementation method is very difficult to use as it is associated with a large number of technological constraints which are to be found all along the different steps of the method. An identical problem exists with respect to the document US2010/0291771 which teaches the formation of areas of small dimensions and areas of large size with the same photolithography step and with etching of the bulk substrate. The document US2010/0291771 uses the Sidewall Image Transfer technique to form patterns of small dimension.

OBJECT OF THE INVENTION

It is observed that a requirement exists to provide a fabrication method that is simpler to implement to form a substrate containing groups of patterns with a large diversity in the number of patterns made per given surface unit.

This requirement tends to be satisfied by means of a method which comprises the following steps:
  providing a substrate successively comprising:
    a semi-conductor material layer,
    a first protective mask completely covering a second area of the semi-conductor material layer and leaving a first area of the semi-conductor material layer uncovered,
    a second etching mask partially covering the first area and at least partially covering the second area so as to define and separate a first area and a second area,
  forming lateral spacers on the lateral surfaces of the second etching mask so as to form a third etching mask,
  etching the semi-conductor material layer by means of the third etching mask so as to form a dot made from semi-conductor material in the first area, the first etching mask protecting the second area.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
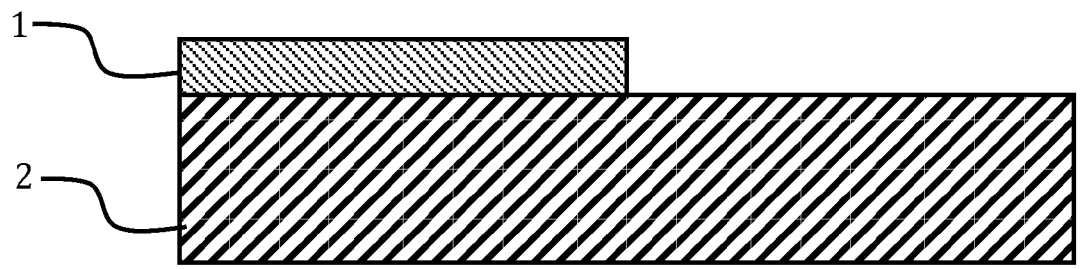
FIGS. 1 to 7 represent, in schematic manner in cross-sectional view, successive steps of implementation of a first method.
Figure 2:
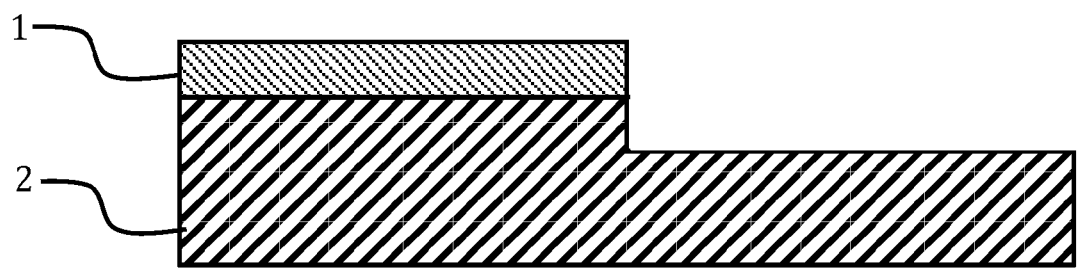
Figure 3:
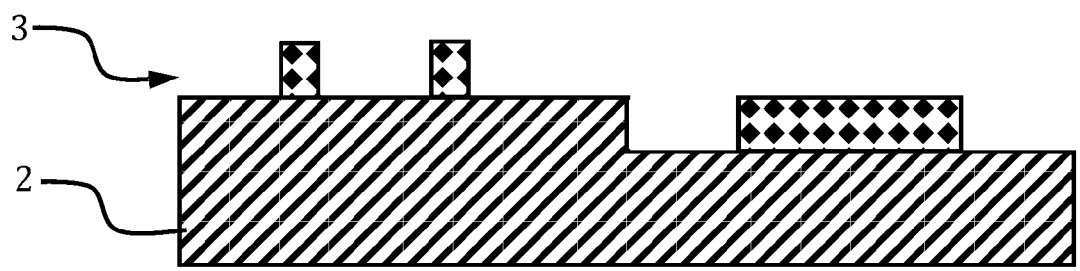
Figure 4:
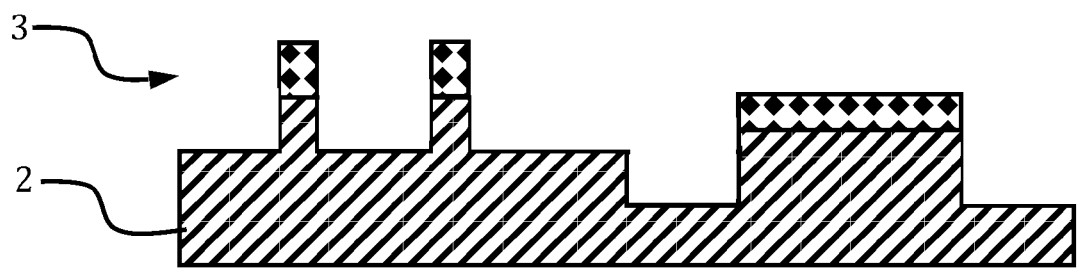
Figure 5:
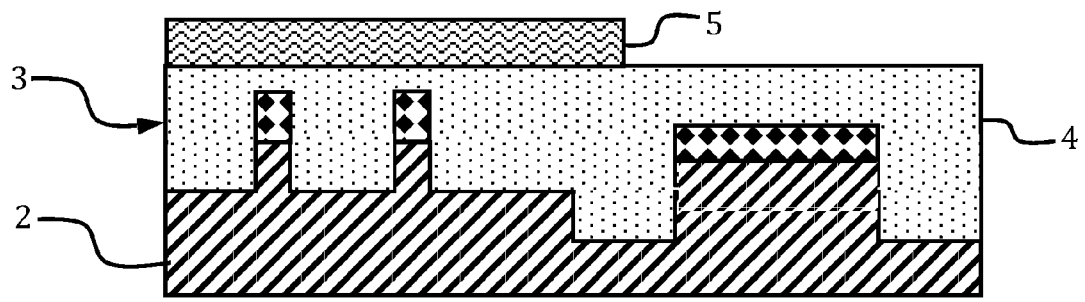
Figure 6:
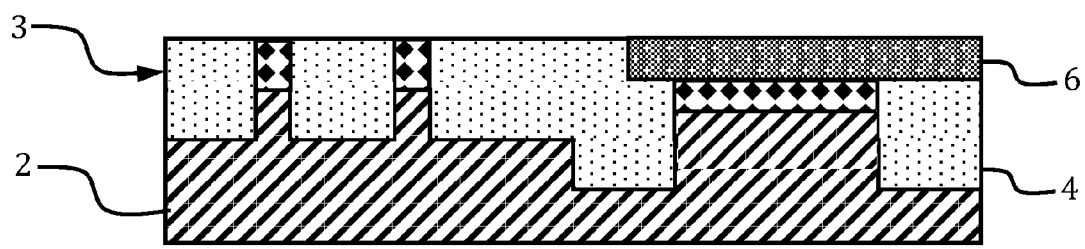
Figure 7:
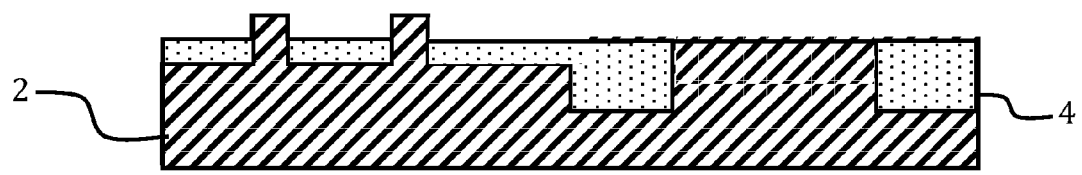
Figure 8A:
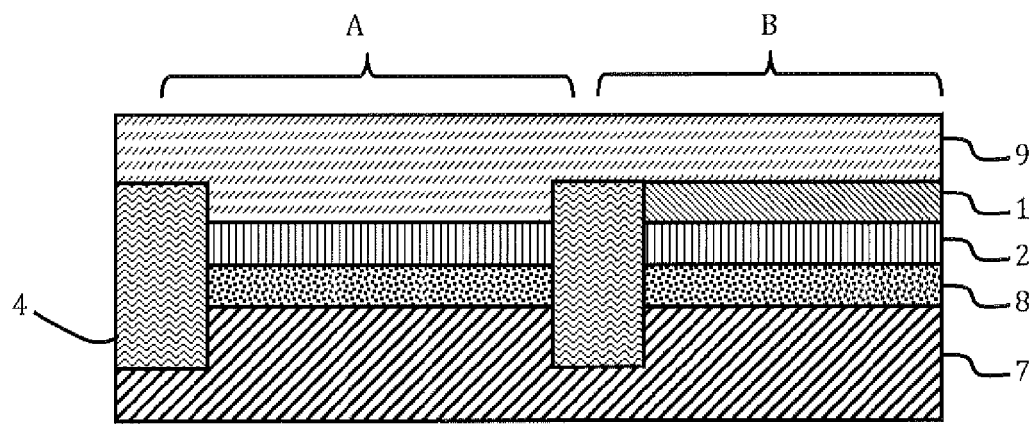
FIGS. 8A-8B and 9-18 represent successive steps of implementation of a second method, in schematic manner in cross-sectional view or in top view.

The initial substrate is a bulk substrate or a substrate of semi-conductor on insulator type. The bulk substrate comprises a semi-conductor material layer 2. The semi-conductor on insulator substrate comprises a support 7 successively covered by an electrically insulating layer 8 and by a semi-conductor material layer 2, as illustrated in FIG. 8A. Electrically insulating layer 8 separates support 7 from semi-conductor material layer 2. For example purposes, the device and method described in the following are obtained on a substrate of semi-conductor on insulator type.

An insulation pattern 4 is advantageously formed in the substrate and is configured to divide semi-conductor material layer 2 into at least two distinct semi-conducting areas. Insulation pattern 4 is sunk into semi-conductor material layer 2 in order to achieve the electric insulation between the different areas of layer 2. Insulation pattern 4 can also sink into electrically insulating layer 8 and possibly into support 7 in order to increase the reliability of the future devices. The different semi-conducting areas are defined and delineated by insulation pattern 4, i.e. insulation pattern 4 surrounds and fixes the limits of the different areas. Insulation pattern 4 is formed by an electrically insulating material, for example a silicon oxide or a silicon nitride. Insulation pattern 4 is produced in conventional manner.

A first protective mask 1 is formed on semi-conductor material layer 2 so as to define a first area A and a second area B. Second area B of semi-conductor material layer 2 is completely covered by first protective mask 1 (FIG. 8A). First area A does not comprise any covering by first protective mask 1. The outline of protective mask 1 can be of any form, and is defined according to the required patterns.

In advantageous manner, insulation pattern 4 is configured to divide semi-conductor material layer 2 into a first area A and a second area B according to the outline defined by first protective mask 1. Insulation pattern 4 and first mask 1 can be arranged in such a way that the outline of the first mask is identical to the outline of second area B, but it is also possible for first mask 1 to extend partially on insulation pattern 4.

Advantageously, insulation pattern 4 and first mask 1 perform the separation between semi-conductor material layer 2 and the etching masks to come. The use of an insulation pattern 4 surrounding first area B and associated with first mask 1 enables the flanks of semi-conductor material layer 2 to be better protected. In this way, there is less parasite etching on the flanks of layer 2 as the steps of the method are progressively performed, which limits the presence of parasite transistors. In advantageous manner, second area B of layer 2 is encapsulated between insulation pattern 4, first mask 1 and electrically insulating layer 8 so as to be protected from any aggression during formation of the semi-conductor material patterns in first area A.

Support 7 is for example a substrate made from semi-conductor material. In preferential manner, support 7 is a silicon substrate.

In advantageous manner, semi-conductor material layer 2 can comprise areas with different thicknesses, for example first area A presents a different thickness from second area B. For example purposes, second area B has a smaller thickness than first area A so as to form high-performance planar devices and FinFET devices that also present high performances. An opposite configuration can also be envisaged.

In yet another embodiment that is able to be combined with the previous embodiments, first area A is formed from a different material from second area B. It is also conceivable to have different crystallographic orientations between first area A and second area B. If several first areas are formed on the substrate, there can be differences of materials, crystalline orientations and/or thicknesses between the first areas A. The same can be the case between the different areas B. These structural differences between area A and area B can be formed on the initial substrate by any suitable technique.

A second etching mask 3 is deposited on the substrate so as to partially cover the substrate. Second mask 3 can have an interface with layer 2 or an intermediate layer can be present between layer 2 and mask 3. Second etching mask 3 is configured so as to partially cover first area A so that first area A presents areas covered by second mask 3 and uncovered areas. First protective mask 1 can be completely covered, partially covered or completely uncovered by second mask 3. In advantageous manner, first protective mask 1 is completely covered by second etching mask 3. An etching selectivity exists between the material forming first mask 1 and the material forming second mask 3.

Second etching mask 3 is for example a photoresist or a material of different nature. In certain embodiments, second etching mask 3 is made from silicon oxide, silicon nitride, a stack of the latter or another material. When second etching mask 3 is not a resin, it is advantageous to define its shape by means of a photolithography step followed by an etching step of a covering layer 9 located under a mask formed by photolithography. Second etching mask 3 is also called hard mask.

Figure 9:
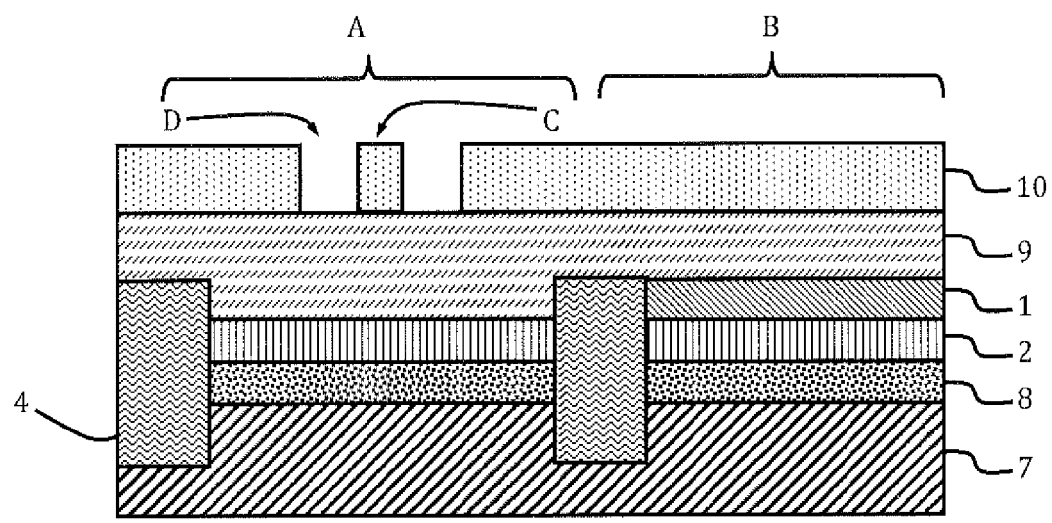
Figure 10:
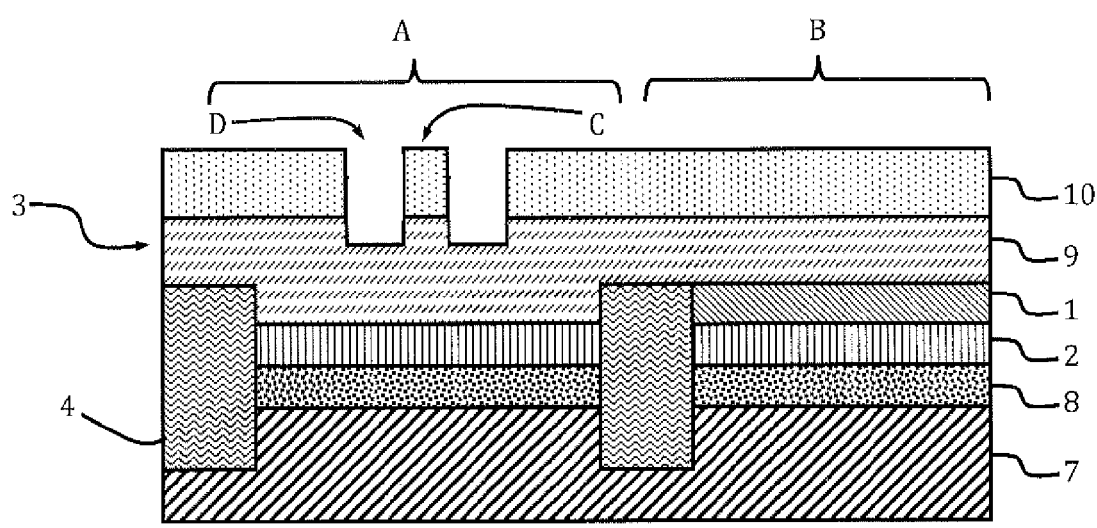

As illustrated in FIGS. 9 and 10, second etching mask 3 also defines a main area C and a secondary area D in first area A of semi-conductor material 2. Main area C is covered by second etching mask 3 and secondary area D is uncovered and is therefore left free. The outline of second etching mask 3 can be of any form and is defined according to the required patterns.

In advantageous manner, main area C extends on each side up to insulation pattern 4 which makes it possible to avoid having to perform an additional photolithography step for defining the length of the final pattern. The length of the final pattern is defined by the size of area A of semi-conductor material layer 2.

Figure 8B:
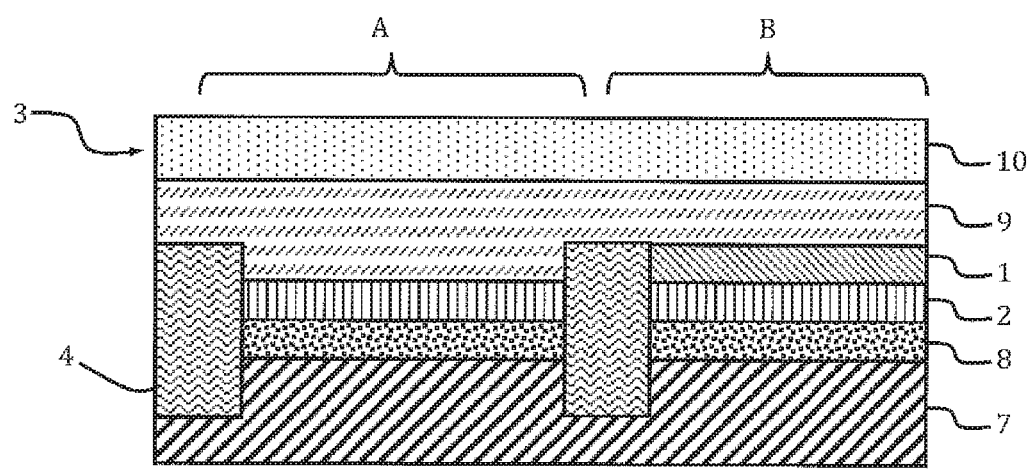
Figure 11:
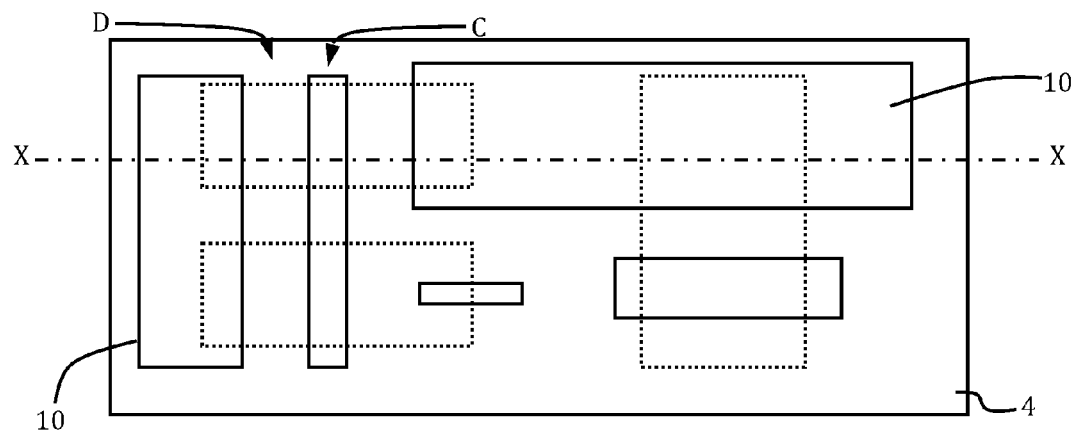

In a particular embodiment illustrated in FIGS. 10 and 11, a covering layer 9 is deposited on the substrate so as to at least partially cover the substrate. Covering layer 9 is arranged to cover first etching mask 1 and therefore second area B. A provisional mask 10 is deposited on covering layer 9 first as a full layer devoid of a pattern (FIG. 8B) and is patterned and configured so as to define areas C and D in covering layer 9 and to form second etching mask 3.

In advantageous manner, covering layer 9 completely covers the substrate, i.e. first area A and second area B. Covering layer 9 can be formed by one or more elementary layers. In a particular embodiment, covering layer 9 is a material of Spin On Carbon type.

In advantageous manner, second etching mask 3 completely covers the outline of first protective mask 1. This configuration enables the number of materials present at the surface of the substrate to be limited, which facilitates definition of the etching method. First protective mask 1 is thus covered by second etching mask 3.

Second area B of layer 2 is directly covered by first protective mask 1 and first area A of layer 2 is directly covered by covering layer 9 forming second mask 3. First protective mask 1 is arranged between semi-conductor material layer 2 and second mask 3, here between semi-conductor material layer 2 and covering layer 9. First mask 1 prevents direct contact between semi-conductor material layer 2 and covering layer 9 in second area B.

First protective mask 1 is for example a silicon oxide, a silicon nitride, a mixture or a stack of the latter. First protective mask 1 can be formed from another material so long as the nature of its constituent is compatible with its position between semi-conductor material layer 2 and covering layer 9. For example purposes, first protective mask 1 has a thickness comprised between 10 and 20 nm.

For example, the material of second mask 3 is a carbonaceous material deposited by chemical vapor deposition or by spin coating. For example, the material used is represented by the formula CxHy which translates a material of more less hydrogenated carbon type, a material of Spin On Carbon type being able to be used. The thickness of second mask 3 is advantageously comprised between 20 and 100 nm. In advantageous manner, the material of second mask 3 is a silicon-based material the composition of which is close to $SiO_2$. It is also possible to use a multilayer one of the layers of which is silicon-based. The material of second etching mask 3 can comprise a silicon-based material of Si AntiReflective Coating (or Si-ARC) type.

As illustrated in FIG. 10, in cross-section along the line XX, second mask 3 is at least partially formed from covering material 9 by any suitable etching technique by means of provisional mask 10. Depending on the embodiments, covering layer 9 can be etched over its whole thickness to form second mask 3 by means of provisional mask 10. Provisional mask 10 can then be kept or eliminated. In other embodiments, covering layer 9 is etched over a part of its thickness by means of provisional mask 10. The provisional mask is then eliminated and covering layer 9 is etched again so as to form second etching mask 3 uncovering a part of semi-conductor material layer 2. The difference of thickness initially defined in covering layer 9 by means of the provisional mask serves the purpose of defining the final outline of second mask 3 after etching to partially release layer 2.

In yet another embodiment, second etching mask 3 is formed in covering layer 9 without necessarily releasing a part of semi-conductor material layer 2 as illustrated in FIG. 10.

Figure 22:
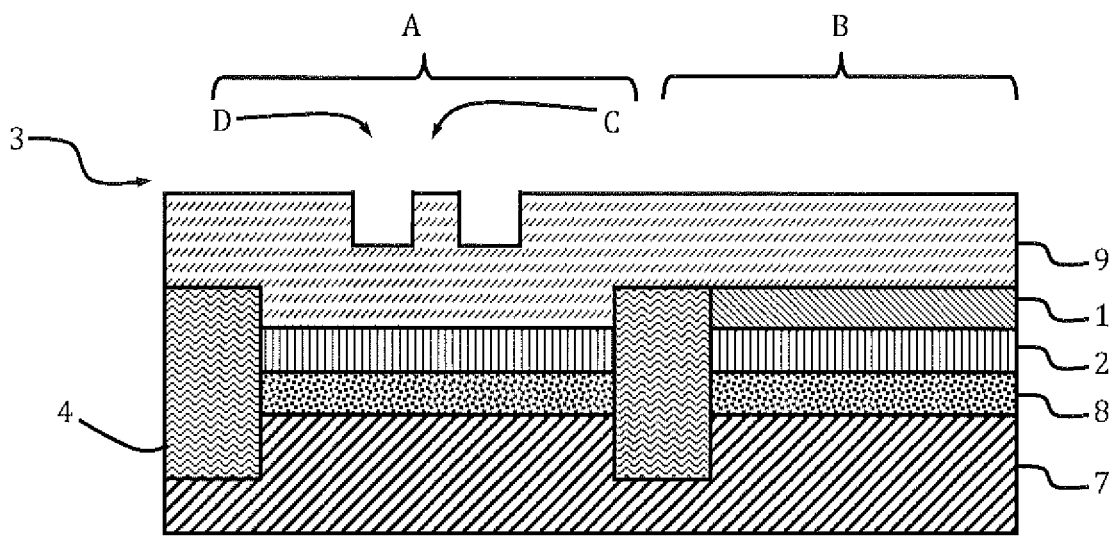
FIG. 22 represents an alternative embodiment of FIG. 10.

FIG. 22 depicts an alternative embodiment of FIG. 10 but wherein the second masking layer is different from the provisional mask. Thus, the second etching mask 3 can be formed in covering layer 9 (as in FIG. 22).

FIG. 11 illustrates different patterns of provisional mask 10 in top view. The different patterns of the provisional mask define one or more main areas C and one or more secondary areas D. Different first areas of layer 2 (areas delineated by dashed lines) are represented and are surrounded by insulation pattern 4. The provisional mask partially covers the insulation pattern and the first areas. It is also possible for the provisional mask to completely cover some first areas 1. According to the embodiments, a main area C can cover one or more first areas A.

The part of covering material 9 left free is partially etched so as to form a salient pattern in covering layer 9. This partial etching is represented by areas of different thicknesses. In main area C covered by second etching mask 3, the thickness is unchanged and represents a thick area. In the uncovered secondary area D, covering layer 9 has been partially eliminated and this corresponds to a thin area of layer 9.

The design of second etching mask 3 has been reproduced in covering layer 9 and the outline of the design is formed by the side walls which are vertical or substantially vertical and which join the thin area to the thick area. The thin area has substantially the same outline as area C and the thick area has substantially the same outline as area D. Etching of covering layer 9 being performed on a part only of the thickness of the covering material, the height of the side wall in layer 9 is smaller than the thickness of covering layer 9.

Covering layer 9 is therefore etched so as to form areas with different thicknesses, which results in the presence of salient patterns in the layer of covering material on a continuous film made from covering material 9.

Covering layer 9 covers all or part of semi-conductor material 2 and first mask 1. In a particular embodiment, semi-conductor material layer 2 and first protective mask 1 are completely covered by covering layer 9.

In advantageous manner, etching is performed by plasma by imposing the etching time or by controlling the etching thickness by in-situ reflectometry.

Figure 12:
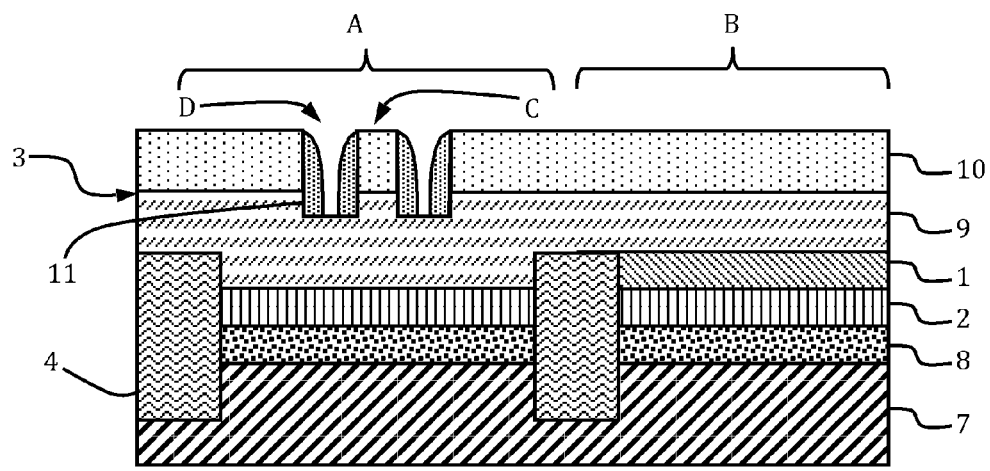

As illustrated in FIG. 12, a masking material 11 is then deposited in conformal manner or in the most conformal possible manner on the assembly and covers second etching mask 3. In certain embodiments, masking material 11 is in contact with second etching mask 3 and the part of covering layer 9 which does not form the second etching mask.

In a conformal deposition, the thickness deposited on the vertical walls is identical to the thickness deposited on the horizontal walls. Once masking material 11 has been deposited, the latter is etched by any suitable technique, preferably with anisotropic etching plasma, in order to form lateral spacers. Etching enables masking material 11 to be localized on the vertical walls defined in second etching mask 3, i.e. on the vertical walls of second etching mask 3. In this way, after the etching step, masking material 11 forms lateral spacers which cover the side walls of second etching mask 3, here the side walls of covering material 9 and of provisional mask 10.

Masking material 11 can be formed by any suitable material, for example an electrically insulating or conducting material. In preferential manner, masking material 11 is made from silicon nitride, stoichiometric or not, silicon oxide, titanium nitride, hafnium oxide or boron nitride. For example purposes, masking material 11 is deposited in a thickness range comprised between 5 nm and 50 nm. The deposited thickness enables the lateral dimension of the semi-conductor material patterns to be defined.

The spacers made from masking material 11 form a third etching mask 5a. The outline of third etching mask 5a is defined partially by the outline of second etching mask 3 which imposes the position of the lateral spacers. The outline of third etching mask 5a is also defined from the thickness of masking material 11 deposited and the etched thickness to define the dimensions of the lateral spacers.

Figure 14:
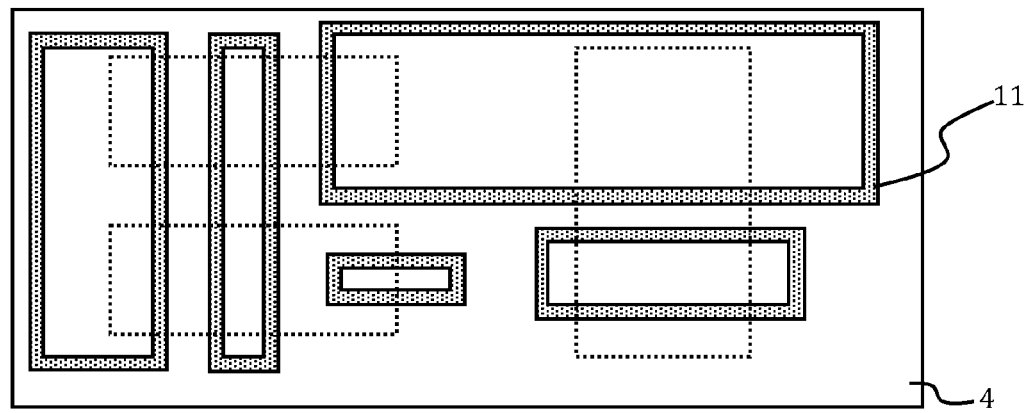

As illustrated in FIG. 14, masking material 11 forms a continuous peripheral spacer around each pattern of mask 3. This particular outline of masking material 11 forms third etching mask 5a.

Figure 13:
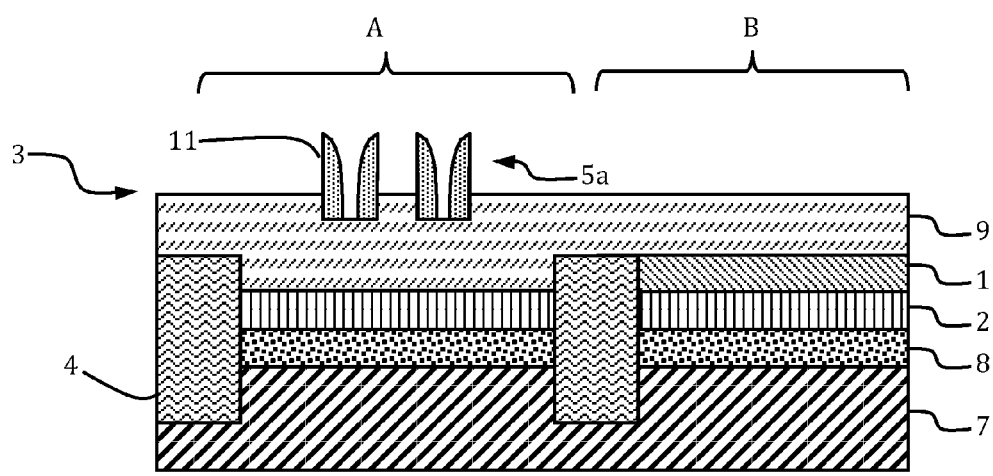
Figure 15:
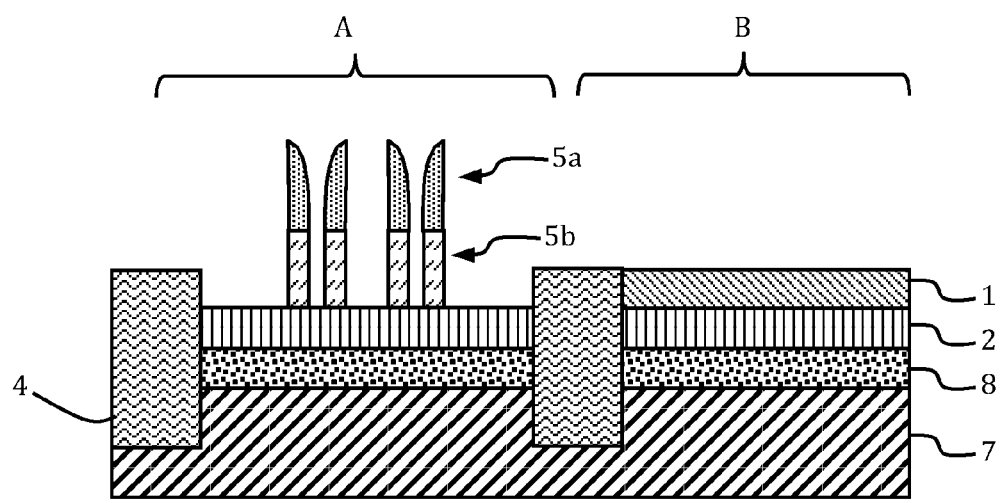
Figure 16:
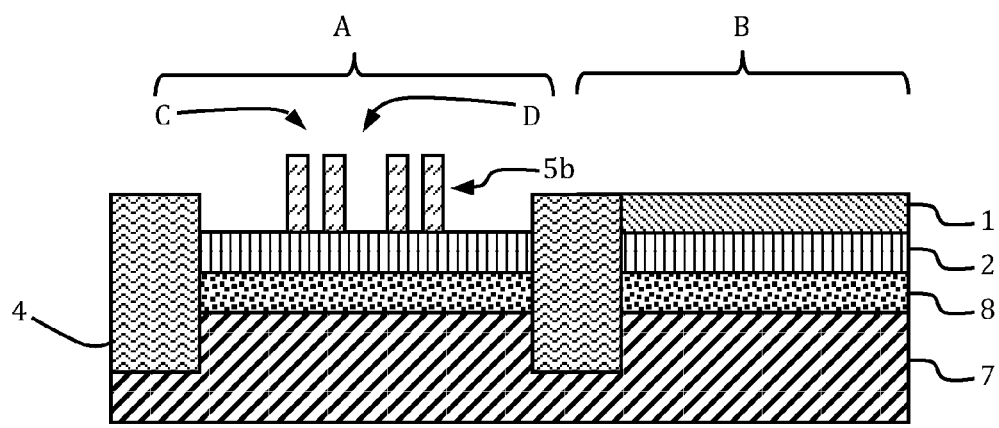
Figure 17:
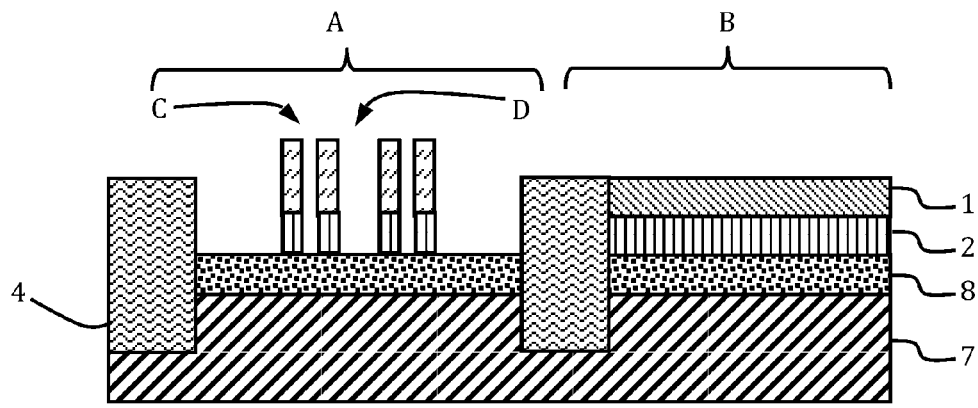

As illustrated in FIG. 15, covering layer 9 is etched to form a fourth etching mask 5b formed by the masking material which defines a pattern salient from covering layer 9 which is representative or advantageously identical to third etching mask 5a. This is shown in FIGS. 15 and 16 as a bottom part of the etching mask 5b formed in covering layer 9 and a top part of the etching mask 5a formed in masking material 11 (with reference to FIG. 13). As illustrated in FIGS. 16 and 17, first area A of semi-conductor material layer 2 is etched by means of the patterns of covering layer 9 which form fourth mask 5b. First protective mask 1 prevents etching of semi-conductor material layer 2 in area B. In this manner, it is possible to form patterns of semi-conductor material of large dimensions and of small dimensions in simple manner. The patterns of small dimensions are formed by means of spacers made from masking material 11 which enables a great flexibility of fabrication both as far as the integration density and the size of the pattern to be formed are concerned. The patterns of large dimensions are formed by means of first protective mask 1 which is produced directly by lithography and etching. In preferential manner, the patterns are equidistant from one another.

Figure 18:
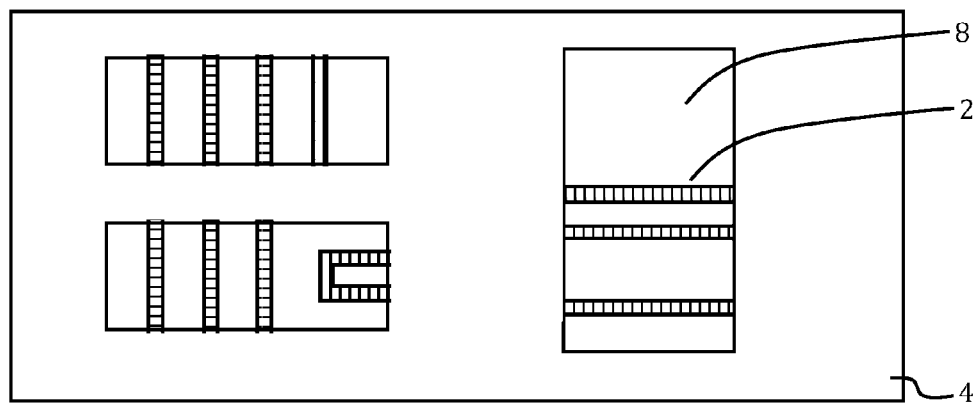

FIG. 18 illustrates a top view of the different patterns of semi-conductor material 2 originating from fourth etching mask 5b. When main area C passes completely through a first area A, fourth etching mask 5b also passes through first area A to overlap insulation patterns 4 on each side. When the etching step by means of fourth etching mask 5b is performed, the pattern of semi-conductor material 2 is defined by the size of fourth mask 5b and by the size of first area A. The semi-conductor material pattern is bounded by insulation pattern 4. This embodiment enables a size of the semi-conductor material pattern to be defined by means of the delineation step of first area 1. It is however possible to add an additional photolithography and etching step to delineate semi-conductor material pattern with respect to what is defined by the size of first area A.

When main area C does not pass completely through a first area A, there is a continuity of the pattern which is for example U-shaped. To avoid this continuity and to form two distinct patterns, it is possible to perform an additional photolithography and etching step of the third mask and/or of the semi-conductor pattern obtained.

The spacers made from masking material 11 can be eliminated before etching layer 2 (FIG. 16), but it is also possible to keep them and to eliminate them only after etching of layer 2. The different types of delineations described in the foregoing can be combined with one another.

This integration may make it possible to form, on a single substrate, semi-conducting areas with an electric insulation performed by means of insulation pattern 4 and semi-conducting areas electrically insulated by etching of layer 2, i.e. by elimination of layer 2.

The use of a covering layer 9 associated with a provisional mask 10 leaves a great flexibility on the thickness of second etching mask 3 when the latter is defined. This flexibility of integration greatly improves control of the size of the lateral spacers serving the purpose of defining third mask 5a and therefore the patterns in layer 2. The choice of the thickness of second mask 3 releases the constraints in the masking material deposition method and in the etching method which enables the spacers to be formed.

In advantageous manner, the patterns of small dimensions are used to form three-dimensional transistors where several surfaces of the pattern are used to command transit of the current, for example transistors called FinFET transistors. The patterns of large dimensions are used to form planar transistors.

Figure 19:
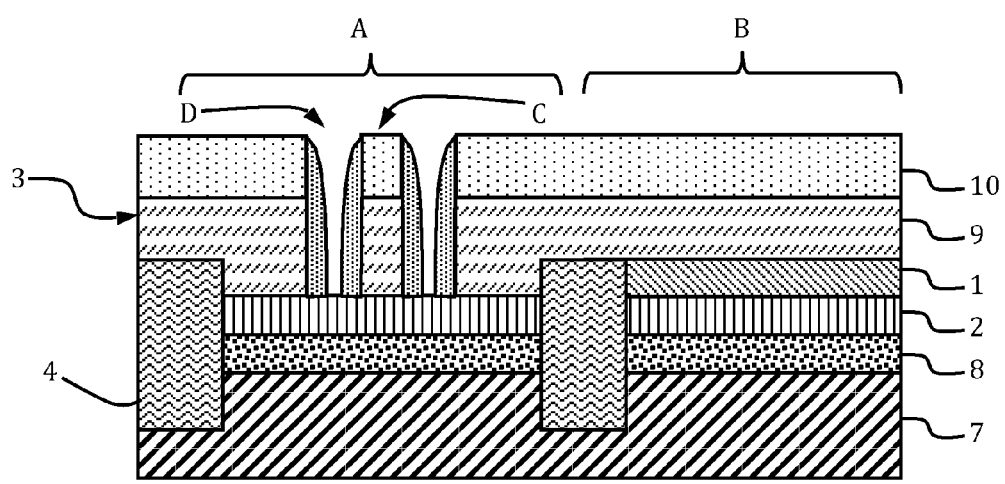
FIG. 19 represents a cross-sectional view of an alternative embodiment in relation with FIG. 11, in schematic manner.
Figure 20:
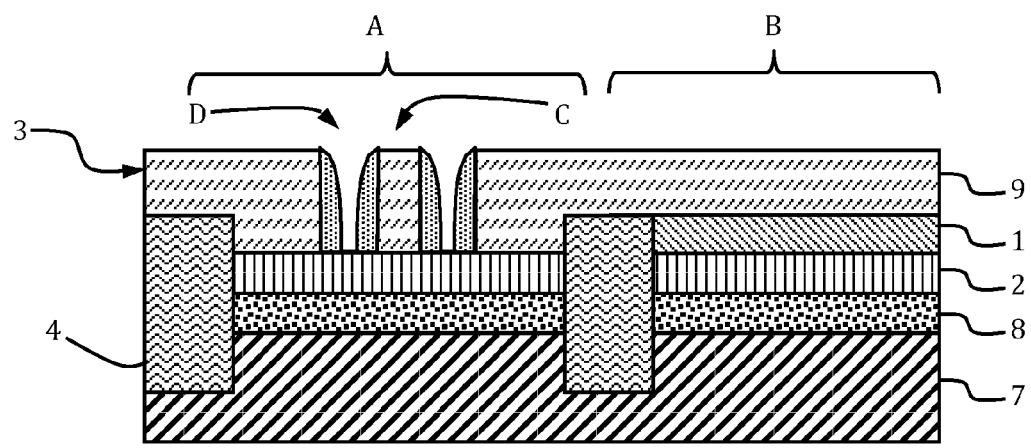
FIG. 20 represents a cross-sectional view of another alternative embodiment in relation with FIG. 11, in schematic manner.

In the embodiment illustrated in FIG. 19, the outline of second etching mask 3 has been defined in covering layer 9 through provisional mask 10 until semi-conductor material layer 2 is reached. The outline of the pattern is formed by side walls which are vertical or substantially vertical and which join the top of second mask 3 to layer 2. Masking material 11 is deposited and then etched as previously so as to form lateral spacers in contact with semi-conductor material layer 2. Mask 3 is formed by association of provisional mask 10 and covering layer 9. In this embodiment, it is possible to eliminate provisional mask 10 after formation of the lateral spacers or before formation of the lateral spacers, as illustrated in FIG. 20. FIGS. 12, 19 and 20 show three variants of definition of second mask 3.

In general manner, the method for making patterns in area A can be summed up in the following manner:
  forming lateral spacers on the lateral surfaces of second etching mask 3 so as to form a third etching mask 5a and potentially a fourth etching mask 5b,
  etching semi-conductor material layer 2 by means of third etching mask 5a or the fourth etching mask 5b so as to form a pattern of semi-conductor material in first area A, first etching mask 1 protecting second area B.

The semi-conductor material patterns are formed in first area A, their thickness having been defined beforehand when the characteristics of first area A are defined. If several first areas A are formed, it is possible to define areas with different characteristics without this greatly modifying the definition step of the semi-conductor material patterns. The semi-conductor material patterns 2 reproduce the outline of third etching mask 5a.

First etching mask 1 can then be eliminated so as to enable access to second semi-conductor material area B for example to form a transistor or another device.

This embodiment is particularly advantageous as it enables simple fabrication of a substrate with semi-conducting areas having a large size, and advantageously makes it possible to fabricate second area B covered by first mask 1 and areas with a smaller size within first area A.

The semi-conductor patterns in first area A originate from the dimensions of the spacers, and it is therefore possible to circumvent dimensional control errors related to the photolithography steps.

In a particular embodiment which can be combined with the previous embodiments, it is possible to perform ion implantation of electrically active impurities in the support. The impurity introduced is advantageously chosen from arsenic, boron, indium and phosphorus. The doping impurity is implanted in the support over a depth comprised between 10 nm and 500 nm from the interface between support 7 and electrically insulating layer 8.

First protective mask 1 may if required be used to modulate the thickness of implantation of the doping impurity in the support, for example by blocking the doping impurity or by making this doping impurity be implanted in electrically insulating layer 8 and not in the support. In this manner, it is possible to define a counter-electrode simply and advantageously an electric insulation device by pn or np diode in support 7 facing first area A. In other cases, additional photolithography steps are possible to define the areas to be implanted and the areas to be protected.

In another embodiment which can be combined with the previous embodiments, two adjacent patterns formed in area A can be connected by means of selective deposition of an electrically conducting material. In preferential manner, selective epitaxy is performed from the patterns so as to make a semi-conductor material, for example silicon, grow laterally to obtain the connection with the adjacent patterns. The initial pattern can be partially masked so as to localize the connection area with the adjacent pattern. In advantageous manner, the contact area between the two adjacent patterns is silicided in order to reduce the extent of possible defects on the final electric performances of the device.

Figure 21:
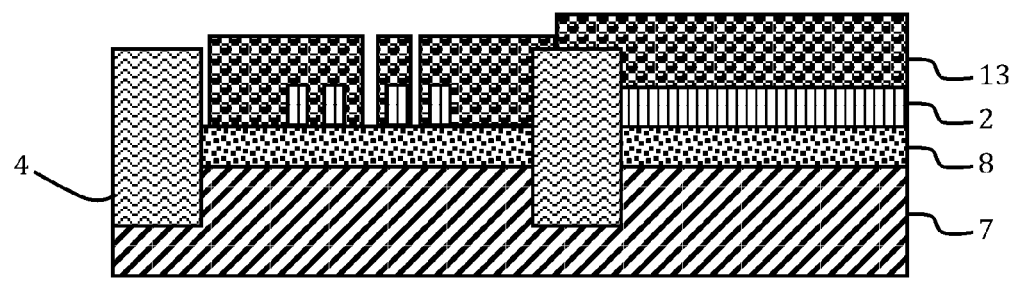
FIG. 21 represents a cross-sectional view of a planar transistor and several FinFET transistors, in schematic manner.

As illustrated in FIG. 21, a gate dielectric material which is electrically insulating can then be deposited or formed, in advantageous manner over the whole of the substrate and in even more advantageous manner on first area A and on second area B. However, in order to achieve a specialization of the devices between first area A and second area B, it is possible to form a second gate dielectric either in first area A or in second area B.

A gate electrode 12 which is electrically conducting is then formed, for example by deposition of the suitable material and etching of the latter. Additional lateral spacers may be formed and implantation can subsequently be performed to define the source and drain electrodes of the transistor. In the example of FIG. 20, a gate electrode is common to two semi-conductor patterns of first area A, i.e. to two transistors of first area A. There is also a gate electrode common to a transistor of first area A and to a transistor of second area B.

Partial silicidation of the source and drain electrodes is advantageously performed before formation of an electrically conductive contact to reduce the access resistance. The same can be the case for the gate electrode.

In advantageous manner, first mask 1 is produced in conventional manner, i.e. by a technique other than by Sidewall Image Transfer technique, and it is possible to obtain patterns having a large width. It is then easy to align second etching mask 3 with respect to first mask 1.

The use of a first mask 1 obtained with the Sidewall Image Transfer technique imposes patterns of small size which makes alignment of the subsequent photolithographic levels difficult. It is therefore particularly interesting to form first mask 1 in conventional manner to facilitate the different alignments of the successive photolithographic levels. This configuration enables the surface topology and therefore the use of planarizing material to be reduced. A high topology induces reflectivity disparities for lithography which are detrimental to obtain the required resolution. This high topology also induces local temperature differences which are a function of the density of the underlying patterns and which modify the dimensions of the patterns in the final outcome.

On the contrary, in the described method, first mask 1 which defines the first and second areas is made on a topology-free surface and presents a thickness that is advantageously smaller than etching mask 5 formed by the Sidewall Image Transfer technique. The effect of first mask 1 on the definition of second etching mask 3 is thereby reduced.

In a particular embodiment, differences between the initial outline of mask 5 or of mask 3 may exist if etching of covering material 9 comprises an isotropic component or if a trimming step reduces the size of the patterns or makes the smallest patterns disappear.

In the alternative embodiment illustrated in FIG. 19, provisional mask 10 is eliminated before depositing masking material 11 and forming the lateral spacers. The height of the lateral spacers is defined from the depth of sinking into the covering material 9 which leaves the same operating margins as in the previous embodiments. This variant is particularly advantageous as it only requires etching selectivity between the material of the provisional mask and covering material 9, which releases the constraints in the choice of the materials.

Etching of covering material 9 over a part of it is thickness enables these constraints to be at least partially released. The photolithography step is performed over a certain thickness of covering material 9. This thickness is chosen in order to facilitate the photolithography step. The layer of covering material 9 is then etched to form a thick area and a thin area and this difference of thickness is used to facilitate definition of the lateral spacers with the selected dimensional ratio. Definition of the spacers is facilitated as a larger choice of materials is accessible, the difficulties in obtaining a conformal deposition being partly overcome by the flexibility in the choice of difference of thickness between the thin area and the thick area.

When the substrate is a bulk substrate, it is advantageous to perform electric insulation of one or more patterns with respect to the rest of the substrate by any suitable means, for example by means of one or more diodes formed in the substrate.

In also advantageous manner, the substrate can comprise areas called bulk areas and areas presenting a structure of semi-conductor on insulator type. In this configuration, it is preferable to fabricate first area A in an area of semi-conductor on insulator type.

The invention claimed is:

1. A method for producing a substrate comprising the following steps:
   providing a substrate comprising:
     a semi-conductor material layer,
     an insulation pattern passing through the semi-conductor material layer and arranged to separate and delineate a first area and a second area of the semi-conductor material layer,
     a first protective mask completely covering the second area of the semi-conductor material layer and leaving the first area of the semi-conductor material layer uncovered, and
     a second etching mask partially covering the first area and at least partially covering the second area, the first protective mask being disposed between the semi-conductor material layer and the second etching mask,
   forming lateral spacers on the lateral surfaces of the second etching mask and removing the second etching mask so as to form a third etching mask, the lateral spacers overlapping the first and second areas of the semi-conductor material layer, and
   etching the semi-conductor material layer by means of the third etching mask so as to form a pattern made from semi-conductor material in the first area, the first etching mask protecting the second area of the semiconductor material layer.

2. The method according to claim 1, comprising:
   depositing a covering layer, covering the semi-conductor material layer, the insulation pattern and the first protective mask,
   forming a provisional mask on the covering layer, and
   etching the covering layer by means of the provisional mask to form the second etching mask at least partially in the covering layer.

3. The method according to claim 2, wherein the covering layer is partially etched before depositing a masking material forming the lateral spacers, the lateral spacers being devoid of contact with the semiconductor material layer.

4. The method according to claim 2, wherein the covering layer is partially etched before depositing a masking material forming the lateral spacers so that the lateral spacers are in contact with the semiconductor material layer.

5. The method according to claim 3, wherein the provisional mask is removed before forming lateral spacers.

6. The method according to claim 1, comprising:
eliminating the first protective mask and/or the third etching mask to release the pattern made from semi-conductor material of the semi-conductor material layer, and
depositing a gate dielectric and a gate electrode on the semi-conductor material layer to define a first transistor in the first area and a second transistor in the second area.

7. The method according to claim 1, wherein the substrate comprises:
a support, and
an electrically insulating layer,
the semi-conductor material layer separated from the support by the electrically insulating layer.

8. A method for producing a substrate comprising the following steps:
providing a substrate comprising:
a semi-conductor material layer,
an insulation pattern passing through the semi-conductor material layer and arranged to separate and delineate a first area and a second area of the semi-conductor material layer,
a first protective mask completely covering the second area of the semi-conductor material layer and leaving the first area of the semi-conductor material layer uncovered,
a covering layer covering the semi-conductor material layer, the insulation pattern and the first protective mask, and
a second etching mask partially covering the first area and at least partially covering the second area, the first protective mask being disposed between the semi-conductor material layer and the second etching mask,
forming lateral spacers on the lateral surfaces of the second etching mask and removing the second etching mask so as to form a third etching mask, the lateral spacers overlapping the first and second areas of the semi-conductor material layer,
etching the covering layer by means of the third etching mask so as to form a fourth etching mask in the covering layer, and
etching the semi-conductor material layer by means of the fourth etching mask so as to form a pattern made from semi-conductor material in the first area, the first etching mask protecting the second area of the semi-conductor material layer.

9. The method according to claim 8, comprising:
forming a provisional mask on the covering layer and
etching the covering layer by means of the provisional mask to form the second etching mask at least partially in the covering layer.

10. The method according to claim 8, wherein the covering layer is partially etched before depositing a masking material forming the lateral spacers, the lateral spacers being devoid of contact with the semi-conductor material layer.

11. The method according to claim 10, wherein the provisional mask is removed before forming the lateral spacers.

12. The method according to claim 8, comprising:
eliminating the first protective mask and/or the third etching mask to release the pattern made from semi-conductor material of the semi-conductor material layer, and
depositing a gate dielectric and a gate electrode on the semi-conductor material layer to define a first transistor in the first area and a second transistor in the second area.

13. The method according to claim 8, wherein the substrate comprises:
a support, and
an electrically insulating layer,
wherein the semi-conductor material layer is separated from the support by the electrically insulating layer.

* * * * *